United States Patent [19]
Okamoto et al.

[11] Patent Number: 4,561,317
[45] Date of Patent: Dec. 31, 1985

[54] ARM MECHANISM FOR A PUSHBUTTON TYPE TUNER

[75] Inventors: Kazuhiko Okamoto; Takao Chaki, both of Tokyo, Japan

[73] Assignee: Clarion Co., Ltd., Tokyo, Japan

[21] Appl. No.: 561,249

[22] Filed: Dec. 13, 1983

[30] Foreign Application Priority Data

Dec. 14, 1982 [JP] Japan ............... 57-188023[U]

[51] Int. Cl.[4] ............... F16H 35/18; H03J 5/06; B21D 22/24
[52] U.S. Cl. ................... 74/10.33; 334/7; 72/356
[58] Field of Search ......... 72/356; 74/10.27, 10.29, 74/10.31, 10.33

[56] References Cited

U.S. PATENT DOCUMENTS

| | | | |
|---|---|---|---|
| 3,186,209 | 6/1965 | Friedman | 72/356 |
| 4,248,102 | 2/1981 | Shimazu | 74/10.33 |
| 4,312,122 | 1/1982 | Gunter | 72/356 |
| 4,331,038 | 5/1982 | Naoi | 74/10.33 |
| 4,348,911 | 9/1982 | Tanaka | 74/10.33 |
| 4,463,618 | 8/1984 | Ohashi | 74/10.33 |
| 4,478,097 | 10/1984 | Tanaka | 74/10.33 |

OTHER PUBLICATIONS

American Machinist, vol. 52, No. 8, Feb. 19, 1920.

Primary Examiner—William L. Freeh
Attorney, Agent, or Firm—Flynn, Thiel, Boutell & Tanis

[57] ABSTRACT

Arm mechanism for a pushbutton type tuner including an arm plate for supporting rotatably a frequency defining plate and a plate spring mounted on this arm plate and locking said frequency defining plate at its periphery, whereby a projection is formed at the base portion of said arm plate by embossment both from the upper and lower surfaces of the arm plate.

2 Claims, 4 Drawing Figures

ARM MECHANISM FOR A PUSHBUTTON TYPE TUNER

BACKGROUND OF THE INVENTION

This invention relates to an arm mechanism for a pushbutton type tuner ameliorating dimensional precision.

The broadcast station selecting mechanism in car radios is so designed that both manual and automatical selections are possible and a special arm mechanism for automatic selection is disposed therein. The arm mechanism is utilized in order that, when a station has been once selected by means of a manual tuning knob, the tuned frequency is memorized by its position on a memory slider, which is moved in synchronism with the tuning knob.

FIGS. 1(a) and 1(b) show such an arm mechanism, in which 1 denotes a pushbutton; 2 represents an arm plate, an end of which is inserted by force into the pushbutton 1, for supporting rotatably a frequency defining plate 3, and 4 is a plate spring mounted on the arm plate 2 and having a pair of branches 4A and 4B, the free ends of which are inserted by force into the pushbutton 1, thus locking the frequency defining plate 3. The frequency defining plate 3 is a cam having a frequency defining pin 5 at its extremity and mounted rotatably on the arm plate 2 by a setting pin 6. 7 and 8 are pins for fixing the plate spring to the arm plate 2.

In the above-described mechanism, prior to automatic selection, when the memory slider 9 disposed on the plate spring 4, which is moved in synchronism with the (not shown) tuning knob, is in a tuning position and the pushbutton 1 is pushed, the frequency defining plate 3 gets under the memory slider 9. At the same time the frequency defining pin 5 is guided by a wave shaped guide 10 and advances in a valley of the wave shaped guide. A procedure for memorizing a tuned frequency is then accomplished by the fact that the frequency defining pin 5 is held between the branches 4A and 4B (locked). After this procedure has been once done, for automatic selection it is enough to push the pushbutton 1. Even if the memory slider 9 is at a random location, since the wave shaped guide 10 is guided by the locked frequency defining pin 5, the memory slider 9 is returned to the memorized original location, and thus the broadcast station, whose frequency has been beforehand tuned, is selected. Thus, by disposing so many pushbuttons that their number corresponds to that of broadcast stations to be selected, it is possible to select arbitrarily desired one.

Furthermore, in such an arm mechanism, a projection (pin) 11 is disposed at the base part of the arm plate 2, which projection 11 is guided by a slit 12 disposed in the frame body of the radio so that the arm plate 2 is able to go backward and forward.

This projection 11 has been heretofore formed, as indicated in FIG. 2, by embossment. That is, the projection 11 has been formed by using a punch 14 from the upper surface of a plate 2′, of which the arm plate should be made, held on a die 13.

In this case, since the projection 11 has been worked only from one side, a tapered portion 15 has been inevitably formed at the periphery of the projection 11 and therefore it has been difficult to obtain a high dimensional precision. By this reason it has been difficult that the arm plate 2 goes backward and forward with a high precision in the slit 12 and consequently tuning has tended to deviate.

OBJECT OF THE INVENTION

The object of this invention is, therefore, to remove this drawback.

SUMMARY OF THE INVENTION

In order to achieve this object, an arm mechanism for a pushbutton type tuner, according to this invention, includes an arm plate for supporting rotatably a frequench defining plate and a plate spring mounted on this arm plate and locking said frequency defining plate at its periphery, whereby a projection is formed at the base portion of said arm plate by embossment both from the upper and lower surfaces of the arm plate.

Hereinbelow this invention will be described more in detail, referring to an embodiment shown in the drawing.

DETAILED DESCRIPTION OF THE PREFERRED EMBODIMENT

Figure 1:
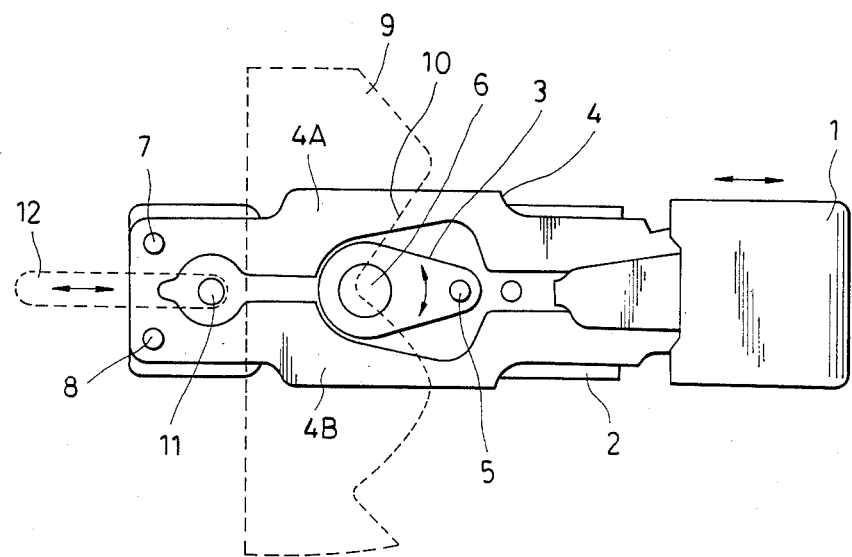
FIGS. 1(a) and 1(b) are a plan view and a side elevation, respectively, of a prior art arm mechanism.
Figure 1:
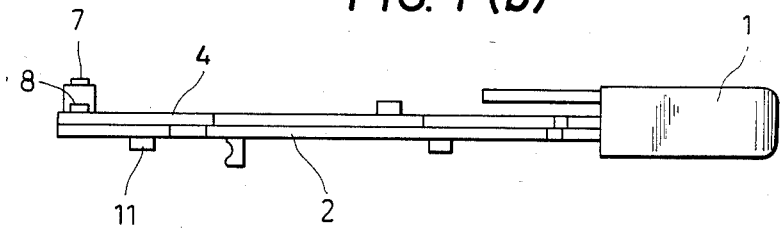
Figure 2:
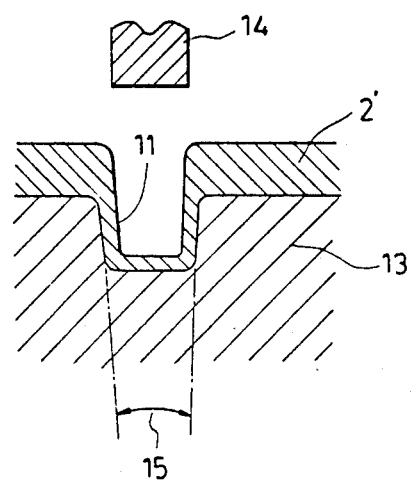
FIG. 2 is a cross-sectional view showing a step for forming a projection according to the prior art.
Figure 3:
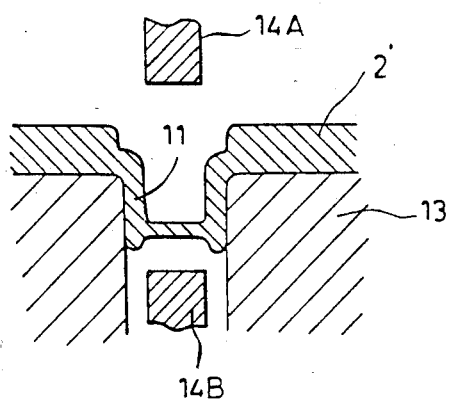
FIG. 3 is a cross-sectional view showing a step for forming a projection according to this invention.

In FIG. 3 a plate 2′, of which will be made an arm plate, is held on a die 13. Then, a projection is formed by means of a punch 14A from the upper side. After that the projection 11 is poked in the reverse direction with a punch 14B from the lower side. In this way the flank of the projection is pushed by force against the inner surface of the die 13 and thus the tapered part, which is formed by working with the punch 14A from the upper side, is so corrected that the flank is substantially perpendicular to the surface of the plate. Consequently dimensional precision is also ameliorated.

In this way, since it is possible that the arm plate 2 goes backward and forward with a high precision, frequency deviation can be obviated. Furthermore, since the projection 11 is made of the plate 2′ itself, which will be later an arm plate 2 and thus it is not necessary to prepare a separate pin, cost reduction can be expected.

As it is clear from the above description, according to this invention, since the arm mechanism includes an arm plate for supporting rotatably a frequency defining plate and a plate spring mounted on this arm plate and locking said frequency defining plate at its periphery, whereby a projection is formed at the base portion of said arm plate by embossment both from the upper and lower surfaces of the arm plate, the drawback of the prior art arm mechanism is removed.

We claim:

1. In an arm mechanism for a pushbutton tuner which comprises a frame body having an elongated slit therein, a pushbutton movable in a direction lengthwise of said slit, a frequency defining plate, a memory slide engageable by said frequency defining plate and adapted to be set in a position corresponding to a desired tuning frequency by lengthwise movement of said pushbutton, the improvement which comprises:

an elongated arm plate coupled to said pushbutton and extending lengthwise of said slit, said arm plate having an upper and a lower surface, and means rotatably supporting said frequency defining plate on the upper surface of said arm plate;

a plate spring mounted on the upper surface of said arm plate, said plate spring being coupled to said pushbutton for movement therewith in a direction lengthwise of said slit, said plate spring being adapted to lock said frequency defining plate at its periphery;

a hollow, cup-shaped projection extending downwardly from the bottom surface of said arm plate and extending into said slit for closely guided sliding movement therein so that lengthwise movement of arm plate is guided by said slit, said projection having been formed by moving an upper punch downwardly against the upper surface of a planar arm plate to thereby emboss said arm plate and form a hollow substantially cup-shaped projection the side wall of which tapers in a downward direction and then moving a lower punch upwardly against the central portion of the lower surface of said projection whereby to reshape said side wall so that said side wall is substantially perpendicular to the surface of said arm plate.

2. An arm mechanism as claimed in claim 1, in which the central portion of the lower surface of said projection is planar and is surrounded by a downwardly projecting ridge.

* * * * *